(12) United States Patent
Bang

(10) Patent No.: US 8,601,406 B2
(45) Date of Patent: Dec. 3, 2013

(54) METHOD OF CREATING PHOTO MASK LAYOUT, COMPUTER READABLE RECORDING MEDIUM STORING PROGRAMMED INSTRUCTIONS FOR EXECUTING THE METHOD, AND MASK IMAGING SYSTEM

(75) Inventor: Ju-mi Bang, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1158 days.

(21) Appl. No.: 12/201,701

(22) Filed: Aug. 29, 2008

(65) Prior Publication Data
US 2009/0064085 A1 Mar. 5, 2009

(30) Foreign Application Priority Data
Aug. 31, 2007 (KR) .................. 10-2007-0088314

(51) Int. Cl.
*G06F 17/50* (2006.01)
(52) U.S. Cl.
USPC ............................ 716/55; 716/119; 716/139

(58) Field of Classification Search
USPC ............................................ 716/55, 119, 139
See application file for complete search history.

(56) References Cited

U.S. PATENT DOCUMENTS

| 5,217,916 A * | 6/1993 | Anderson et al. ............. 438/128 |
| 7,257,790 B2 * | 8/2007 | Maeda ............................. 716/53 |
| 7,618,751 B2 * | 11/2009 | Sandstrom et al. ............... 430/5 |

FOREIGN PATENT DOCUMENTS

| JP | 2002-107913 | 4/2002 |
| JP | 2004-077837 | 3/2004 |
| JP | 2004-279643 | 10/2004 |
| JP | 2004-309826 | 11/2004 |

\* cited by examiner

*Primary Examiner* — Thuan Do
(74) *Attorney, Agent, or Firm* — F. Chau & Associates, LLC

(57) ABSTRACT

A method of generating a photo mask layout includes providing a first photo mask layout including main patterns and sub-resolution assist features (SRAF) patterns, defining a plurality of mesh cells by dividing the first photo mask layout into regions, generating a rule based table including correction information for correcting defects in the SRAF patterns for at least one of the plurality of mesh cells, and correcting the SRAF patterns by applying values of the correction information to the SRAF patterns corresponding to each mesh cell.

20 Claims, 12 Drawing Sheets

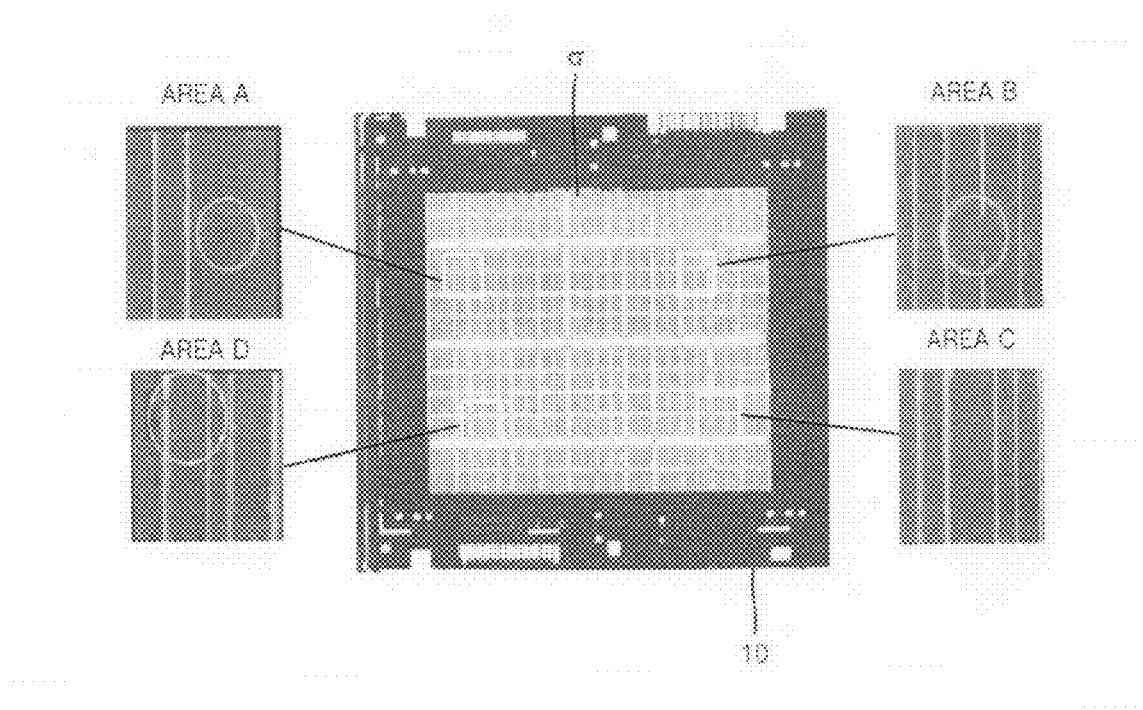

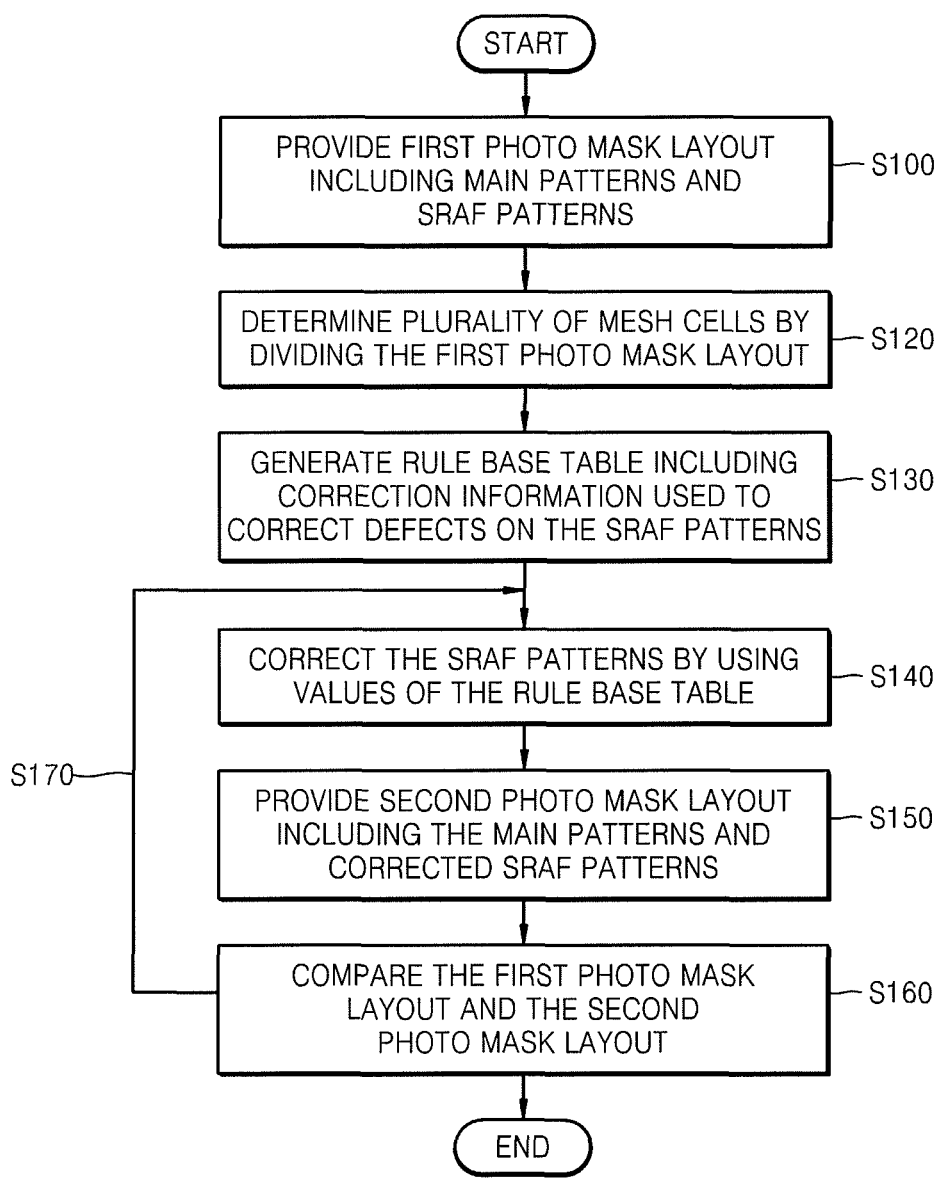

FIG. 3C

| AREA | MESH CELL | SIZE (NM) OF SRAF BEFORE CORRECTED SIZE CORRECTION VALUE | SIZE CORRECTION VALUE |
|---|---|---|---|
| AREA A | M(1, 1) | ABOUT 100 | INCREASE BY 10% |
|  | M(1, 2) | ABOUT 110 |  |
|  | M(2, 1) | ABOUT 110 |  |
|  | M(3, 1) | ABOUT 120 |  |
| AREA B | M(1, 3) | ABOUT 100 | 130 nm |
|  | M(1, 4) | ABOUT 100 |  |
|  | M(2, 2) | ABOUT 100 |  |
|  | M(2, 3) | ABOUT 100 |  |
|  | M(2, 4) | ABOUT 100 |  |
|  | M(3, 3) | ABOUT 100 |  |
|  | M(3, 4) | ABOUT 100 |  |
| AREA C | M(4, 3) | ABOUT 120 | – |
|  | M(4, 4) | ABOUT 120 |  |
| AREA D | M(3, 2) | ABOUT 100 | + 20 |
|  | M(4, 1) | ABOUT 120 |  |
|  | M(4, 2) | ABOUT 110 |  |

RT1

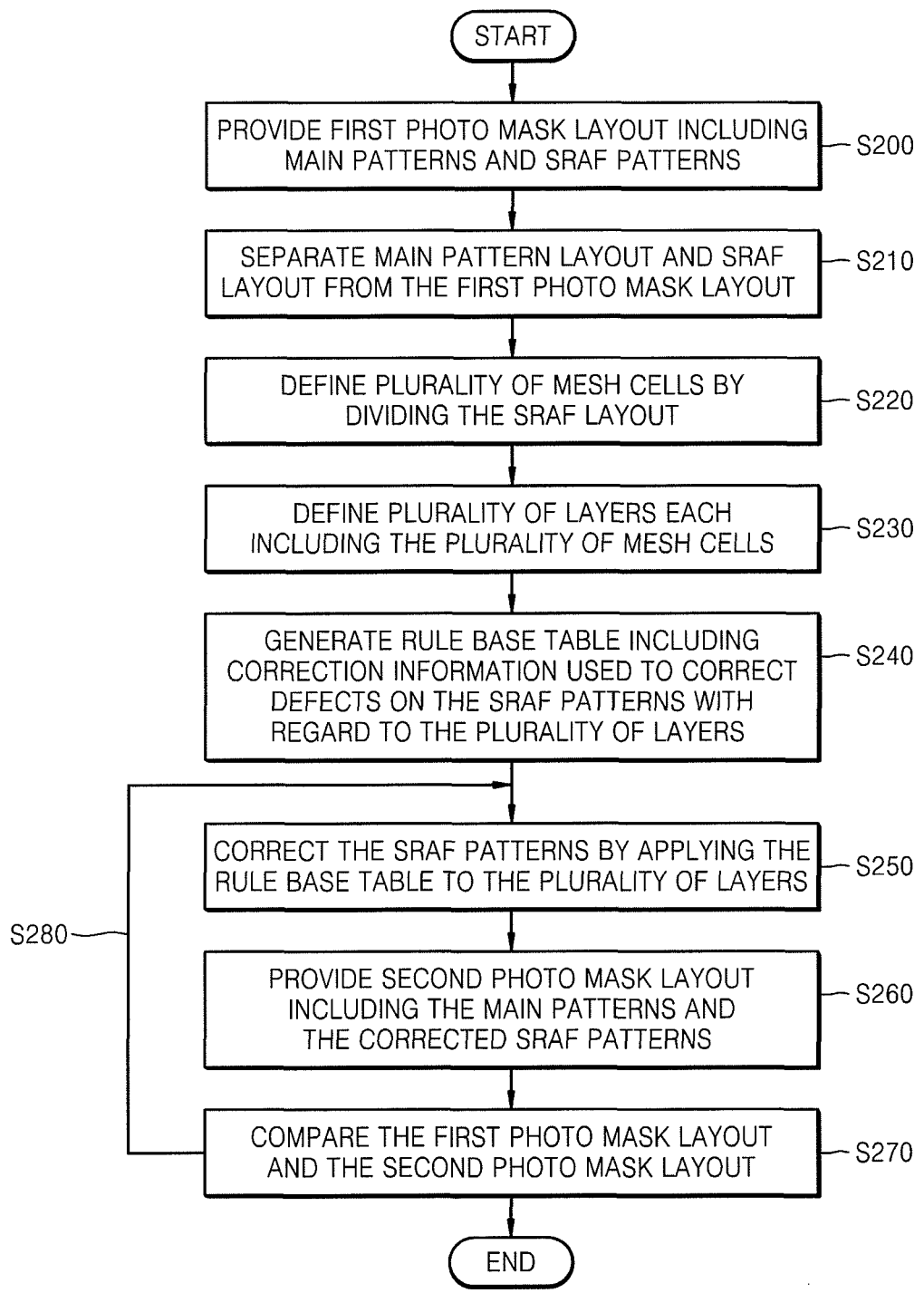

FIG. 5D

| LAYER | MESH CELL | SIZE (NM) OF SRAF BEFORE CORRECTED SIZE CORRECTION VALUE | SIZE CORRECTION VALUE |
|---|---|---|---|
| LAYER L1 | M(1, 1) | ABOUT 100 | INCREASE BY 10% |
| | M(1, 2) | ABOUT 110 | |
| | M(2, 1) | ABOUT 110 | |
| | M(3, 1) | ABOUT 120 | |
| LAYER L2 | M(1, 3) | ABOUT 100 | 130 nm |
| | M(1, 4) | ABOUT 100 | |
| | M(2, 2) | ABOUT 100 | |
| | M(2, 3) | ABOUT 100 | |
| | M(2, 4) | ABOUT 100 | |
| | M(3, 3) | ABOUT 100 | |
| | M(3, 4) | ABOUT 100 | |
| LAYER L3 | M(4, 3) | ABOUT 120 | – |
| | M(4, 4) | ABOUT 120 | |
| LAYER L4 | M(3, 2) | ABOUT 100 | + 20 |
| | M(4, 1) | ABOUT 120 | |
| | M(4, 2) | ABOUT 110 | |

RT2

US 8,601,406 B2

METHOD OF CREATING PHOTO MASK LAYOUT, COMPUTER READABLE RECORDING MEDIUM STORING PROGRAMMED INSTRUCTIONS FOR EXECUTING THE METHOD, AND MASK IMAGING SYSTEM

CROSS-REFERENCE TO RELATED PATENT APPLICATION

This application claims priority to Korean Patent Application No. 10-2007-0088314, filed on Aug. 31, 2007, in the Korean Intellectual Property Office, the disclosure of which is incorporated by reference in its entirety herein.

BACKGROUND OF THE INVENTION

1. Technical Field

The present disclosure relates to methods of creating photo mask layouts and mask imaging systems, and more particularly, to methods and systems of creating photo mask layouts including optical proximity correction (OPC) patterns.

2. Discussion of Related Art

The scaling down of large scale integrated circuits. (LSIs) has been accelerated due to the development of photolithography technology. Photolithography is a process used in micro-fabrication to selectively remove parts of a thin film (or the bulk of a substrate). It uses light to transfer a geometric pattern from a photo mask to a light-sensitive chemical (photoresist, or simply "resist") on the substrate. A series of chemical treatments then engraves the exposure pattern into the material underneath the photoresist. The scale of LSIs has been reduced to 90 nm, 65 nm, 45 nm and lower to meet the ever more stringent design rules for manufacturing semiconductor devices. Therefore, the size of a pattern transferred onto a wafer is substantially smaller than a wavelength of an exposure beam used in the photolithography process, generating an optical proximity effect caused by optical diffraction and interference. However, the resulting optical proximity effect can limit photolithography resolution.

Optical proximity correction (OPC) is a photolithography enhancement technique commonly used to compensate for image errors due to the optical proximity effect. One conventional OPC technique enhances a contrast and sharpness of a main pattern of a photo mask projected on a wafer by adding a sub-resolution assist features (SRAF) pattern to the photo mask.

The number and size of SRAF patterns may be determined according to the size of main patterns and the space between them. A reduction of design rules leads to a reduction in the size and space of the main patterns, which continuously reduces the size of the SRAF pattern. However, it can be difficult to secure a reliable photolithographic process for the reduced SRAF pattern.

FIG. 1 illustrates microscopic images of defects in various SRAF patterns on a photo mask 10 obtained by a conventional photo mask manufacturing process. Referring to FIG. 1, 4 images around the photo mask image 10 are partially enlarged images of respective rectangular areas A through D of the photo mask image 10. The photo mask image 10 is manufactured with the SRAF patterns to fabricate a semiconductor device having a substantial critical dimension (CD) of 45 nm. Missing defects in an SRAF pattern are generated in the area A, bleak defects in an SRAF pattern are generated in the area B, and thinning defects in an SRAF pattern are generated in the area C. No defect in an SRAF pattern is generated in the area D. These defects may be distributed in a circularly scattered pattern σ with various defect types and densities caused by loading errors that frequently occur during the conventional photo mask manufacturing process. The defects in SRAF patterns cause defects at the wafer level, such as collapsing of main patterns to be transferred onto substantial wafers or unwanted transferring of an SRAF pattern onto a wafer.

Thus, there is a need for methods and systems of generating photo mask layouts that can prevent or reduce defects in an SRAF pattern.

SUMMARY OF THE INVENTION

An exemplary embodiment of the present invention includes a method of generating a photo mask layout to fabricate a photo mask with reduced or no defects in sub-resolution assist features (SRAF) patterns by correcting the SRAF patterns of the photo mask layout, which may cause wafer-level defects in a photo mask during a manufacturing process of the photo mask An exemplary embodiment of the present invention includes a method of generating a photo mask layout. The method includes providing a first photo mask layout including main patterns and sub-resolution assist features (SRAF) patterns, defining a plurality of mesh cells by dividing the first photo mask layout into regions, generating a rule based table including correction information for correcting defects in the SRAF patterns for at least one of the plurality of mesh cells, and correcting the SRAF patterns by applying values of the correction information to the SRAF patterns corresponding to each mesh cell.

The method may further include providing a second photo mask layout including the main patterns and the corrected SRAF patterns, verifying the first photo mask layout by comparing the first photo mask layout with the second photo mask layout, and correcting the SRAF pattern by re-applying the values of the correction information to SRAF patterns when the comparison determines that the layouts differ from one another.

One of a shape of each mesh cell, a size of each mesh cell, or the number of the plurality of mesh cells may be determined according to at least one defect at a photo mask level or at a wafer level. The correction information may include a value used to correct at least one of a shape, size, or number of each SRAF pattern. The value used to correct the size of each SRAF pattern may include at least one of a ratio, a critical value, and a bias value.

An exemplary embodiment of the present invention includes a method of generating a photo mask layout. The method includes providing a first photo mask layout including main patterns and SRAF patterns, separating a main pattern layout including the main patterns and an SRAF layout including the SRAF patterns, from the first photo mask layout, defining a plurality of mesh cells by dividing the SRAF layout into regions, defining a plurality of layers each including at least one of the plurality of mesh cells, generating a rule based table including correction information used to correct defects in the SRAF patterns, and correcting the SRAF patterns by applying the correction information to the plurality of layers.

The method may include providing a second photo mask layout including the main patterns and the corrected SRAF patterns by merging the main pattern layout and the plurality of layers, verifying the first photo mask layout by comparing the first photo mask layout with the second photo mask layout, and correcting the SRAF patterns by re-applying the correction information to the SRAF patterns when the comparison determines that the layouts differ from one another.

The comparing the first photo mask layout and the second photo mask layout may be performed by a Boolean operation. An offset value may be applied to perform the Boolean operation.

An exemplary embodiment of the present invention includes a mask image system. The system includes a data storage medium and computer system. The data storage medium stores a first photo mask layout including main patterns and SRAF patterns. The computer system defines a plurality of mesh cells by dividing the first photo mask layout into regions, generates a rule base table including correction information used to correct defects in the SRAF patterns for at least one of the plurality of mesh cells, and corrects the SRAF patterns by applying values of correction information to the SRAF patterns corresponding to each mesh cell.

An exemplary embodiment of the present invention includes a mask image system. The system includes a data storage medium and computer system. The data storage medium stores a first photo mask layout including main patterns and SRAF patterns. The computer system separates a main pattern layout including the main patterns and an SRAF layout including the SRAF patterns, from the first photo mask layout, defines a plurality of mesh cells by dividing the SRAF layout into regions, defines a plurality of layers that each include at least one of the plurality of mesh cells, generates a rule based table including correction information used to correct defects in the SRAF patterns, and corrects the SRAF patterns by applying the correction information to the plurality of layers.

BRIEF DESCRIPTION OF THE DRAWINGS

The present invention will become more apparent by describing in detail exemplary embodiments thereof with reference to the attached drawings in which:

FIG. 1 illustrates microscopic images of defects of various sub-resolution assist features (SRAF) patterns on a photo mask obtained by a conventional photo mask manufacturing process;

FIG. 2 is a flowchart illustrating a method of generating a photo mask layout according to an exemplary embodiment of the present invention;

FIGS. 3A through 3D are views schematically illustrating results obtained by processing the photo mask layout according to the method shown in FIG. 2;

FIG. 4 is a flowchart illustrating a method of generating a photo mask layout according to another exemplary embodiment of the present invention;

FIGS. 5A through 5D are views schematically illustrating results obtained by processing the photo mask layout according to the method shown in FIG. 4.

DETAILED DESCRIPTION OF EXEMPLARY EMBODIMENTS

Figure 3A:
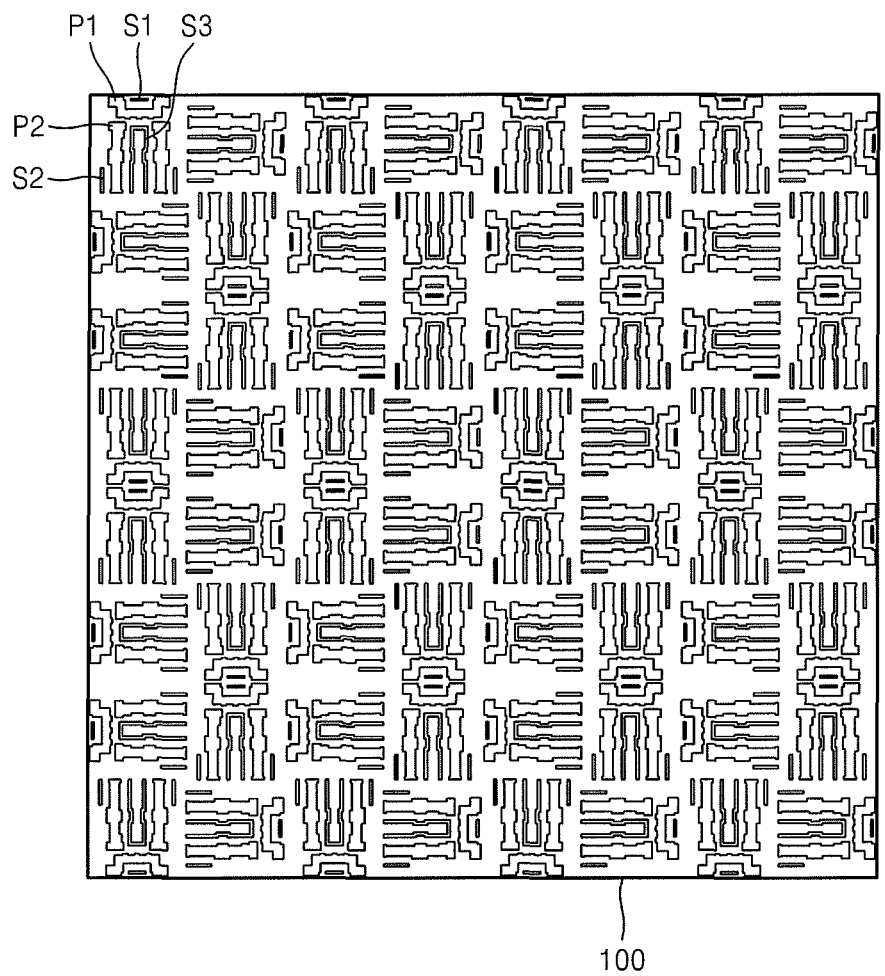

The present invention will now be described more fully hereinafter with reference to the accompanying drawings, in which exemplary embodiments of the invention are shown. However, the invention may be embodied in many different forms and should not be construed as being limited to the embodiments set forth herein.

As used herein, a main pattern refers to a wafer image or a target image that is to be transferred on a wafer. A sub-resolution assist features (SRAF) pattern may be referred to as a scattering bar or an intensity leveling bar. The SRAF pattern may be in the shape of a bar, a serif, a hammer head, or other shapes known to one of ordinary skill in the art. The SRAF pattern may include an auxiliary pattern used for reliable image transfer of main patterns. A layout refers to a collective set of images of main patterns and/or SRAF patterns. A layer used herein refers to a data group which can be applied with values of a rule base table by using an image conversion tool such as PATACON. The PATACON tool is manufactured by the Nippon Control System Corporation.

Hereinafter, various embodiments of the present invention will be described more fully with reference to the accompanying drawings, in which exemplary embodiments of the invention are shown. Modifications of shapes shown in the drawings may be expected according to, for example, a manufacturing technology and/or a tolerance. Hence, the exemplary embodiments of the present invention are not intended to be limited to a specific shape of an area shown in the drawings but, for example, may include a variation of the shape of the area caused by a manufacturing process.

FIG. 2 is a flowchart illustrating a method of creating a photo mask layout according to an exemplary embodiment of the present invention. FIGS. 3A through 3D are views schematically illustrating results obtained by processing the photo mask layout according to the method shown in FIG. 2.

Referring to FIGS. 2 and 3A, a first photo mask layout 100 including main patterns P1 and P2 and SRAF patterns S1 through S3 that are generated by using a layout tool such as a commercially available computer aided design (CAD) software is provided (S100). The SRAF patterns S1 through S3 may have different widths, for example, 100 nm, 110 nm, and 120 nm, respectively. The SRAF patterns S1 through S3 can be generated by using a rules based approach, a model based approach, or a combination thereof. However, the methods of generating the SRAF patterns S1 through S3 are not limited to the above exemplified approaches.

The first photo mask layout 100 is converted into data and the data is input into a mask recording device such as a laser beam writer or an electronic beam writer. Then, a recording process of the mask recording device and a suitable post-process may be performed to fabricate a binary mask or a phase shift mask. Phase-shift masks are photo masks that make use of interference generated by phase differences to improve image resolution in photolithography. The photo mask may have defects in SRAF patterns as shown in FIG. 1. A correcting process according to embodiments of the present invention may be performed to correct the defects in the SRAF patterns and the defects in the main patterns caused by the defects in SRAF patterns. The first photo mask layout 100 can be converted into a suitable type of data such as MEBES or GDS formats so that a program tool executed in a computer system can correct the defected SRAF patterns.

Figure 3B:
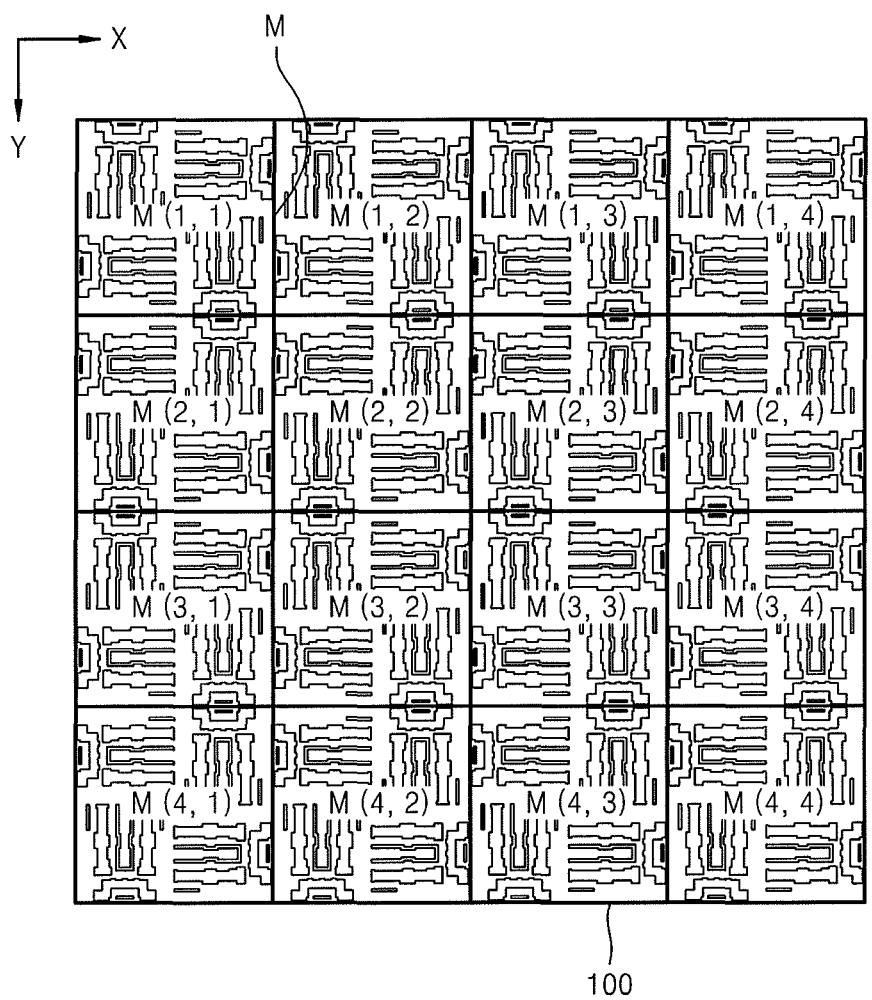

Referring to FIGS. 2 and 3B, a plurality of mesh cells M(1,1), M(1,2), through to M(4,4) M may be defined by dividing the first photo mask layout 100 into regions as a pre-process for correcting the SRAF patterns S1 through S3 (S120). For example, 16 mesh cells M having a 4×4 arrangement may be defined. Each mesh cell M may have location information corresponding to a real coordinate of the first photo mask layout 100, may be mapped to the location information, and may be named and identified as, for example, M(1,1), M(1,2), through to M(4,3), and M(4,4) according to a column and row coordinate system.

Each mesh cell M may have a rectangular shape as shown in FIG. 3B. However, the shape of the mesh cells M is not limited thereto. For example the shape can be determined by considering defect types of SRAF patterns at a photo mask level such as missing, break, and thinning defects of SRAF patterns that occur on a manufactured photo mask and distribution characteristics such as distribution location and density. For example, the mesh cells M may have various polygonal shapes such as a diagonal or hexagonal shape in order to reflect the defect types and distribution characteristics of the SRAF patterns. The size or number of the mesh cells M can be determined by considering SRAF defects of the photo mask level.

In other embodiments of the present invention, as well as considering the above-mentioned defects at a photo mask level, the size or number of mesh cells M can be defined by considering the defects at a wafer level such as collapse of main patterns and unwanted transfer of SRAF patterns, which may occur in the wafer when a photolithography process is performed using a photo mask having the defects of the SRAF at the photo mask level. The extent of variation observed in the type and scattering of defects in SRAF patterns may be greater when defects at the photo mask level and/or the wafer level are analyzed. The first photo mask layout 100 may be divided into a large number of mesh cells M, for example greater than 16, so that the size of each of the mesh cell Ms is smaller and the number of mesh cells M thereof is larger.

Referring to FIGS. 2 and 3C, a rule based table (RT1) including mesh cell correction information used to correct the defects in the SRAF patterns S1 through S3 with regard to at least one mesh cell M is generated (S130). The rule based table RT1 may include a size correction value of a corresponding SRAF pattern of each mesh cell M as shown in a leftmost column. The size correction value may be applied only to the SRAF patterns having a predetermined size, for example, about 100 nm, 110 nm, or 120 nm, from among various SRAF patterns of each mesh cell M, as shown in a column of size before SRAF correction.

It is assumed that at the photo mask level, the missing defects in the SRAF patterns S1 through S3 intensively occur in the cells M(1,1), M(1,2), M(2,1), and M(3,1) (hereinafter referred to collectively as an area A), the bleak defects in the SRAF pattern S1 intensively occur in the cells M(1,3), M(1, 4), M(2,2), M(2,3), M(2,4), M(3,3), and M(3,4) (hereinafter referred to collectively as an area B), the thinning defects in the SRAF patterns S1 through S3 intensively occur in the cells M(3,2), M(4,1), and M(4,2) (hereinafter referred to collectively as an area D), and no defect occurs in the SRAF patterns S1 through S3 in the cells M(4,3) and M(4,4) (hereinafter referred to collectively as an area C).

The above exemplified type and scattering of the defects in the SRAF patterns S1 through S3 are illustrative and may vary according to the size and/or density of the SRAF patterns S1 through S3, and according to various factors involved in the mask recording device, a photo resist, and a photo mask, etc. In at least one embodiment of the present invention, the size correction value may have a value for increasing 10% of the size of the predetermined SRAF patterns S1 through S3 (having a size of about 100 nm, 110 nm, and 120 nm, respectively) in order to correct the missing defects in the SRAF patterns S1 through S3 that occur in the area A. When the size of SRAF patterns S1 is below a critical dimension of the SRAF, it may be inferred that the bleak defect in the SRAF pattern S1 occurs in the area B. The critical dimension can be obtained when the photo mask is manufactured by using an electronic beam writer and a negative photo resist. The size correction value may include a value for increasing collectively the size of the SRAF patterns S1 that are smaller than the critical dimension to a predetermined critical value, for example, 130 nm. The RT1 may not include a size correction value with regard to the area C where no defect occurs in the SRAF patterns S1 through S3.

As a result of analyzing the defects in the area D, when the SRAF pattern S1 having a target size of 100 nm is found to be patterned in 70 nm (in this example, a mean to path (MTT) value of the target size and a manufactured size of the SRAF pattern S1 may be 30 nm), and a required MTT is below 10 nm, it is necessary to bias the SRAF pattern S1 on the photo mask layout by +20 nm and accordingly, the size of the SRAF pattern S1 may increase to 120 nm. When it is required to bias the other SRAF patterns S2 and S3 in order to correct the thinning defects of these SRAF patterns that occur in the area D, the RT1 may also include a bias value such as +20 nm with regard to the SRAF patterns S2 and S3.

In the rule base table RT1, the size correction values include a value for increasing the size of the SRAF patterns at a predetermined ratio (e.g., increase the original size by 10%), a value for increasing the size of the SRAF patterns to a critical dimension value (e.g., increase to 130 nm) or a bias value (e.g., increase by +20 nm). However, the size correction value is not limited thereto. For example, the size correction values may include a value for decreasing the size of the SRAF patterns or a value for deleting the SRAF patterns. Although the rule base table RT1 of FIG. 3C includes correction information regarding the size of the SRAF patterns, a rule base tables according to another embodiment of the present invention may further include correction information regarding the location and/or number of the SRAF patterns.

The rule base table may be generated by analyzing the photo mask manufactured by using the first photo mask layout 100 or by using a predetermined test layout. Thus, step S130 of generating the rule base table and step S120 of defining the plurality of mesh cells M may be performed irrespectively of their sequence.

Thereafter, the SRAF patterns pertaining to each mesh cell may be corrected by applying correction information of the rule base table RT1 to the SRAF patterns (S140). The corrected features, for example, a corrected size of the SRAF patterns is described in a rightmost column (Size (nm) of SRAF after corrected) of Table 1 below.

TABLE 1

Results obtained by an application of Rule base table RT1

| Areas | Mesh Cells | Size (nm) of SRAF before corrected | Size (nm) of SRAF after corrected |
|---|---|---|---|
| Area A | M (1, 1) | About 100 | about 110 |
|  | M (1, 2) | About 110 | about 121 |
|  | M (2, 1) | About 110 | about 121 |
|  | M (3, 1) | About 120 | about 132 |
| Area B | M (1, 3) | About 100 | about 130 |
|  | M (1, 4) | About 100 |  |
|  | M (2, 2) | About 100 |  |
|  | M (2, 3) | About 100 |  |
|  | M (2, 4) | About 100 |  |
|  | M (3, 3) | About 100 |  |
|  | M (3, 4) | About 100 |  |
| Area C | M (4, 3) | About 120 | about 120 |
|  | M (4, 4) | About 120 | about 120 |
| Area D | M (3, 2) | About 100 | about 120 |
|  | M (4, 1) | About 120 | about 140 |
|  | M (4, 2) | About 110 | about 130 |

The size of the corrected SRAF patterns S1' through S3' corresponding to the mesh cells of the area A is increased by 10% from about 100 nm, 110 nm, and 120 nm to about 110 nm, 121 nm, and 132 nm, respectively. The size of the corrected SRAF pattern S1' corresponding to the mesh cells of the area B is increased to about 130 nm. The size of the SRAF patterns S1 through S3 corresponding to the mesh cells of the area C remains unchanged. The size of the SRAF patterns S1" through S3" corresponding to the mesh cells of the area D is increased from about 100 nm, 120 nm, and 110 nm to about 120 nm, 140 nm, and 130 nm, respectively, according to a bias value of +20. When the rule base table RT1 includes a value for correcting the location and/or number of the SRAF patterns corresponding to the mesh cells M, the location and/or number of a specific SRAF pattern corresponding to each mesh cell M may be corrected.

Figure 3D:
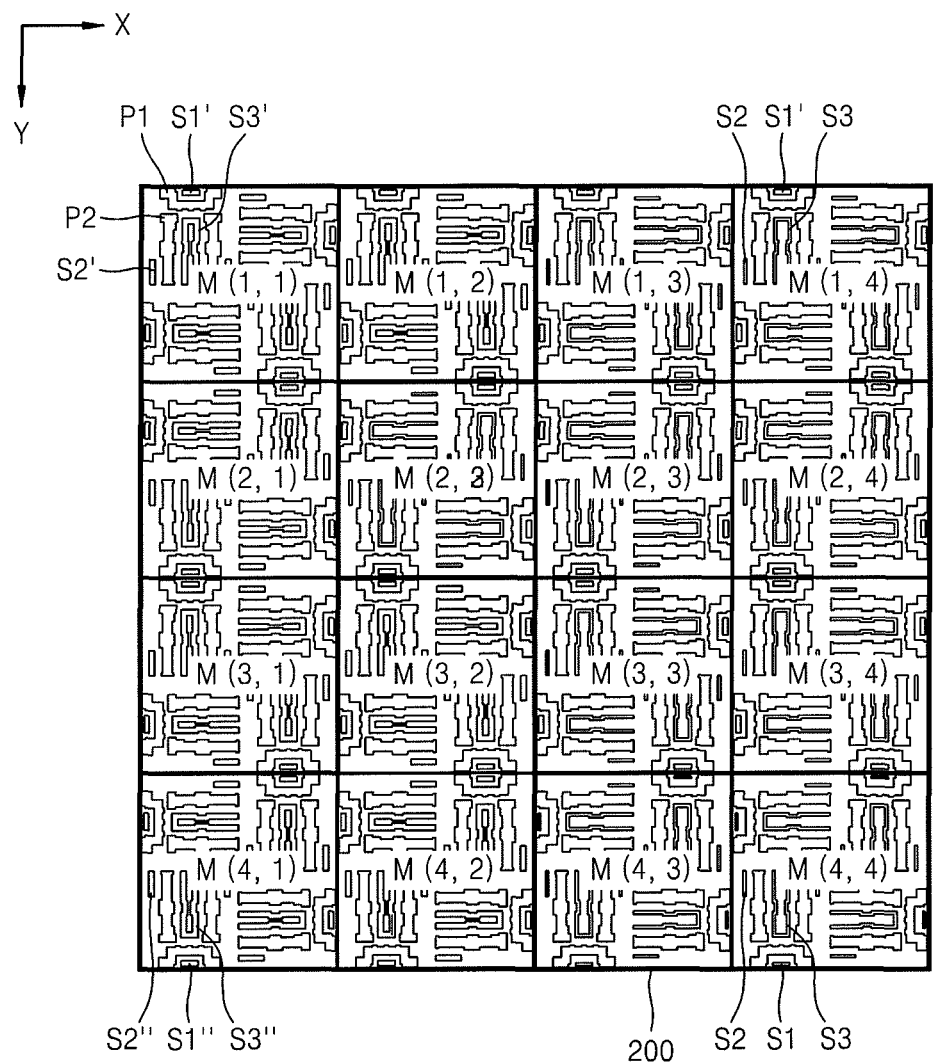

Referring to FIGS. 2 and 3D, a second photo mask layout 200 including the main patterns P1 and P2 and corrected SRAF patterns S1 through S3 for manufacturing a substantial photo mask may be provided (S150). Although the main patterns P1 and P2 of the first photo mask layout 100 are identical to those of the second photo mask layout 200, at least one of the SRAF patterns corresponding to the mesh cells M of the first photo mask layout 100 is different from a corresponding SRAF pattern of the second photo mask layout 200 according to the correction information of the Rule base table. The second photo mask layout 200 may be input into the laser beam writer or the electronic beam writer, etc., and the photo mask may be manufactured according to a suitable writing process, developing process, or an etching process.

Referring to FIG. 2, a step of determining whether the SRAF patterns S1 through S3 of each mesh cell have been accurately corrected may be performed before the photo mask is manufactured by using the second photo mask layout 200 (S160). The step S160 may be performed by comparing the first photo mask layout 100 with the second photo mask layout 200 for verification.

A Boolean operation may be performed to compare the data of the first photo mask layout 100 and the second photo mask layout 200. The SRAF patterns of the second photo mask layout 200 may be different from those of the first photo mask layout 100 according to the correction information. For example, if the correction information is the bias value, an offset value corresponding to the bias value may be applied so that abnormal SRAF patterns other than the accurately corrected SRAF patterns can be extracted.

In step S160, if an error occurs in the corrected SRAF patterns, the step S140 of correcting the SRAF patterns of the first photo mask layout 100 through the step S160 of comparing the first photo mask layout 100 and the second photo mask layout 200 for verification can be performed again (S170).

Since a reduction in the size of the main patterns of the photo mask layout leads to a reduction in the size of the SRAF patterns, the size of the designed main patterns and the size of the SRAF patterns may have a linear relationship. However, when the size of the main patterns is lower than a critical dimension value, which can be secured by an available photo mask process, more reliable SRAF patterns may be formed when this linear relationship is not maintained (broken). According to an embodiment of the method of generating the photo mask layout, the patterns of each mesh cell M may be corrected around the critical dimension value when the linear relationship between sizes of the main patterns and the SRAF patterns is broken, thereby preventing the defects in the SRAF patterns.

According to at least one embodiment of the present invention, the plurality of mesh cells M may be defined on the photo mask layout, the SRAF patterns can be corrected according to defect types of the SRAF patterns corresponding to each of the mesh cells M, and SRAF defects can be corrected in response to defect distribution patterns of the SRAF patterns caused by a loading error that frequently occurs. As a result, a photolithographic process window may be extended, thereby making it possible to manufacture a more reliable photo mask.

FIG. 4 is a flowchart illustrating a method of generating a photo mask layout according to another exemplary embodiment of the present invention. FIGS. 5A through 5D are views schematically illustrating results obtained by processing the photo mask layout according to the method shown in FIG. 4. The present embodiment is different from the embodiment previously described with reference to FIG. 2 in that a main pattern layout and an SRAF layout are separated from a first photo mask layout, and a rule base table value may be applied to the SRAF layout.

Figure 5A:
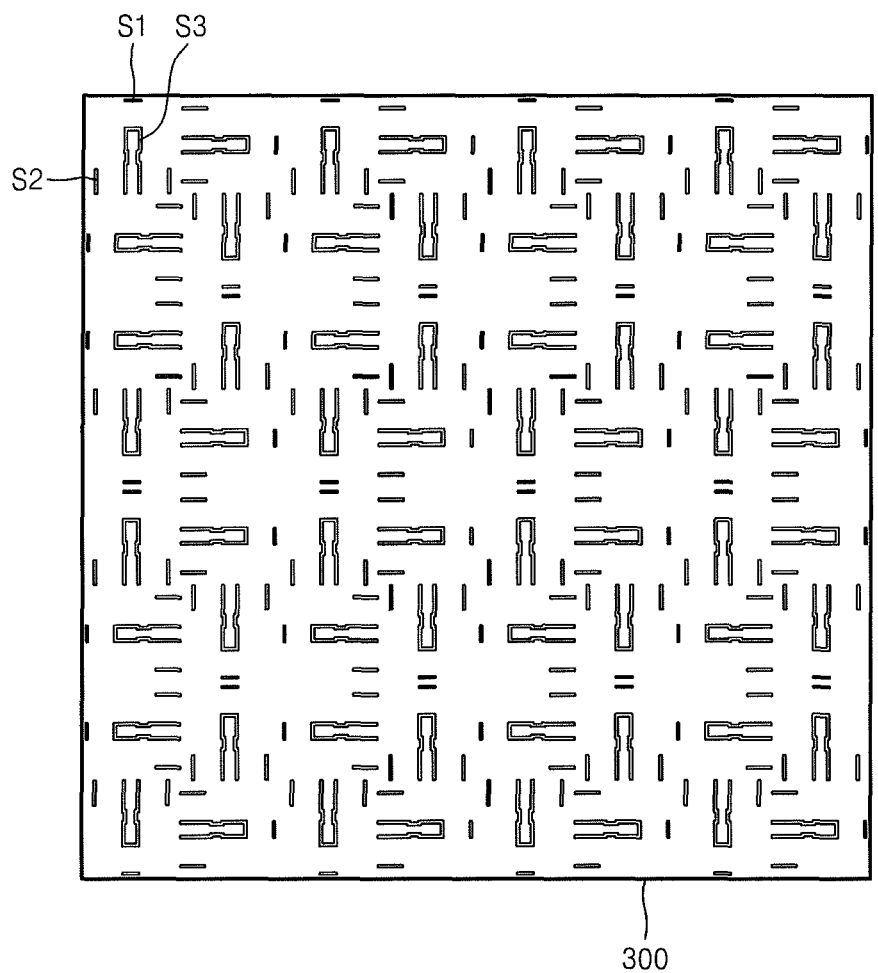

Referring to FIGS. 4 and 5A, the first photo mask layout (100 in FIG. 3A) including the main patterns P1 and P2 and the SRAF patterns S1 through S3 may be provided (S200). A main pattern layout (not shown) including the main patterns P1 and P2 may be separated from the first photo mask layout 100, thereby obtaining an SRAF layout 300 including the SRAF patterns S1 through S3 (S210). A software tool, for example, PATACON, can be used to separate the main pattern layout and the SRAF layout 300 including the SRAF patterns S1 through S3 from the first photo mask layout 100. In this example, a data type of the first photo mask layout can be converted into another data type considering a processing speed and an allowable data format of a mask writing device.

Figure 5B:
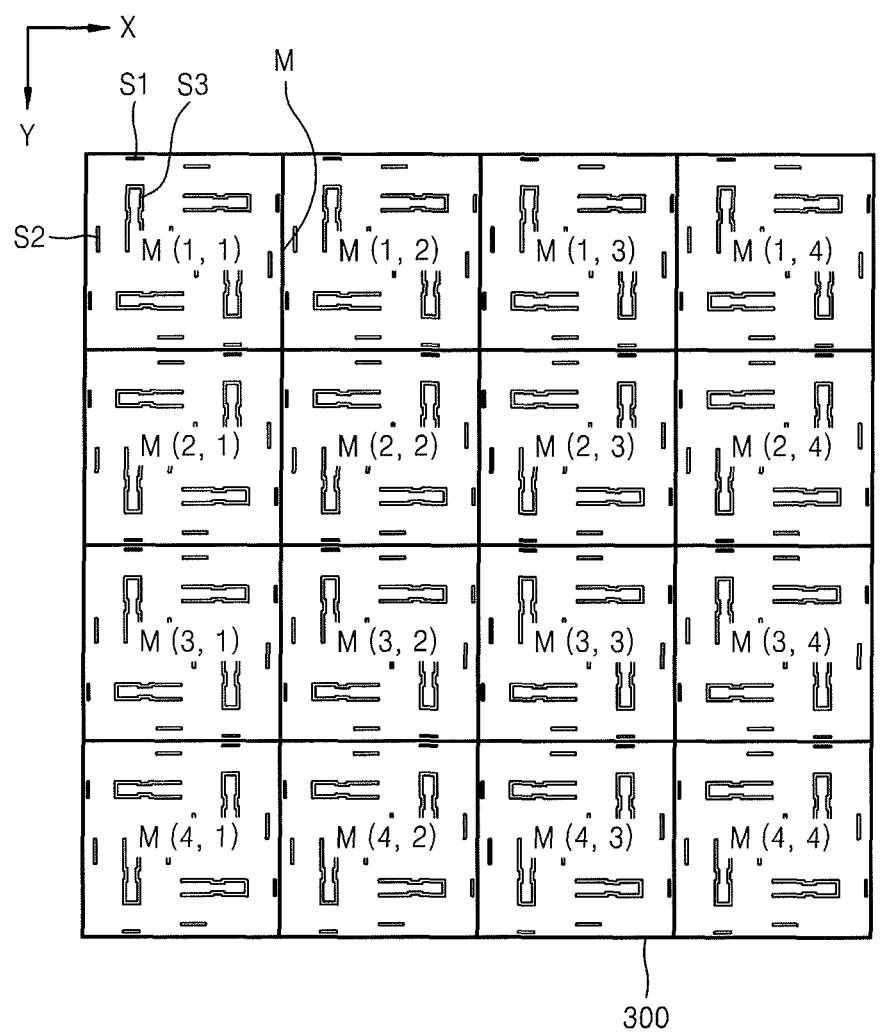

Referring to FIGS. 4 and 5B, a plurality of mesh cells M may be defined on the SRAF layout 300, for example, 16 mesh cells M(1,1), M(1,2), through to M(4,3), and M(4,4), which may be disposed in a 4×4 array, as shown in FIG. 3B. The shape, size and/or number of the mesh cells M can be determined by considering types of SRAF defects that occur during the manufacturing of the photo mask and distribution characteristics thereof, and defects at a photo mask level and/or at a wafer level, which is the same as described with reference to FIG. 2.

Figure 5C:
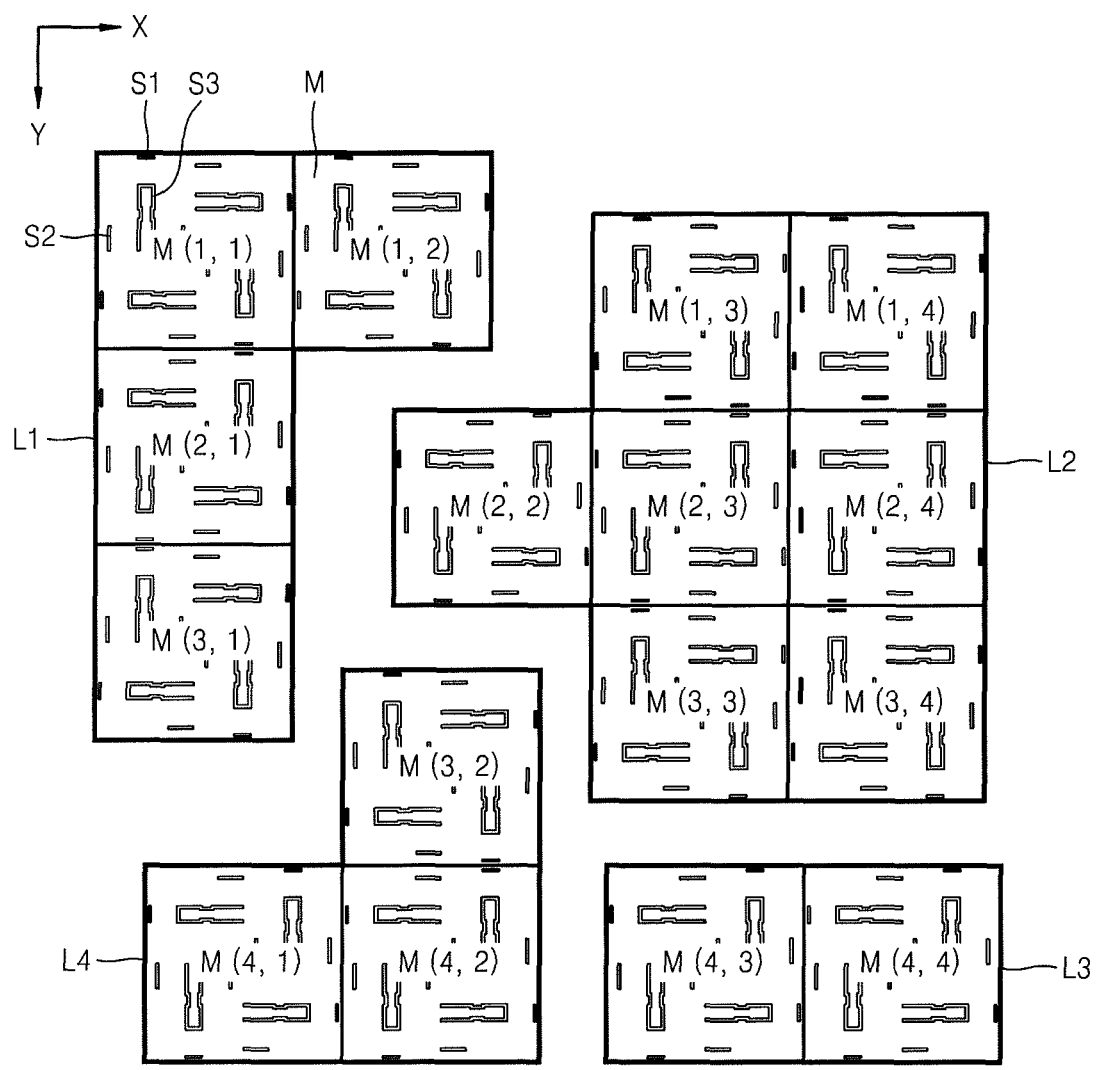

Referring to FIGS. 4 and 5C, a plurality of layers L1 through L4, each layer L including at least one mesh cell, may be defined (S230). If the number of mesh cells is 16, the maximum number of the layers may be 16.

In the present embodiment, each layer L1 through L4 can be defined to include the mesh cells M(1,1), M(1,2), through to M(4,3), and M(4,4) as shown in FIG. 5C according to types, distribution patterns, and characteristics of defects in the SRAF patterns S1 through S3 corresponding to each mesh cell. For example, when missing defects in the SRAF patterns S1 through S3 intensively occur in the mesh cells M(1,1), M(1,2), M(2,1), and M(3,1) of an area A, the size of the four mesh cells may be collectively increased by a predetermined ratio, for example, by 10%. The layer L1 including the four mesh cells can then be defined. When bleak defects in the SRAF pattern S1 intensively occur in the mesh cells M(1,3), M(1,4), M(2,2), M(2,3), M(2,4), M(3,3), and M(3,4) in the area B, the size of the seven mesh cells may be collectively increased to a specific critical value. The layer L2 including the seven mesh cells can then be defined.

Further, since it is necessary to increase the size of the mesh cells M(3,2), M(4,1), and M(4,2) in the area D according to a specific bias value, for example, +20, in order to correct thinning defects in the SRAF patterns S1 through S3 that intensively occur in the three mesh cells, the layer L4 including the three mesh cells can be defined. With regard to the mesh cells M(4,3) and M(4,4) in the area C in which no defect occurs, the layer L3 including the two mesh cells can also be defined. As a result, each layer L may include information on the SRAF patterns corresponding to a mesh cell or a plurality of mesh cells to which the same rule base table value may be applied.

Referring to FIGS. 4 and 5D, a rule base table RT2 having correction information used to correct the defects in the SRAF patterns with regard to at least one of the layers L is generated (S240). Each layer L may include the plurality of mesh cells M having the same defect type. In this example, the rule base table RT2 may include correction information that may be applied collectively to the plurality of mesh cells M. The step S240 may be performed after the other steps S210, S220, and S230. However, step S240 can be performed before the other steps 210, 220, and 230 or simultaneously with the other steps 210, 220, and 230.

Thereafter, defective SRAF patterns may be corrected by applying a value of the rule base table RT2 to at least one layer (S250). For example, in a similar manner to that described with reference to FIG. 3D, the size of SRAF patterns S1 through S3 corresponding to the mesh cells M(1,1), M(1,2), M(2,1), and M(3,1) of the layer L1 may be increased by 10% from about 100 nm, 110 nm, and 120 nm to about 110 nm, 121 nm, and 132 nm. In the mesh cells M(1,3), M(1,4), M(2,2), M(2,3), M(2,4), M(3,3), and M(3,4) of the layer L2, the SRAF pattern S1 is magnified from about 100 nm to about 130 nm. The size of the SRAF patterns S1 through S3 pertaining to the mesh cells M(4,3) and M(4,4) of the layer L3 remains unchanged. The size of SRAF patterns S1" through S3" pertaining to the mesh cells M(3,2), M(4,1), and M(4,2) of the layer L4 may be increased from about 100 nm, 120 nm, and 110 nm to about 120 nm, 140 nm, and 130 nm, respectively, according to a bias value of +20.

When the rule base table RT2 includes the correction information used to correct the location and/or number of the SRAF patterns of each layer L, the location and/or number of the SRAF patterns of each layer may also be corrected.

Referring to FIG. 4, the second photo mask layout 200 (shown in FIG. 3D) including the main patterns P1 and P2 and the corrected SRAF patterns may be provided (S260). In order to generate the second photo mask layout 200 that is to be input into the mask writing device, the layers L including the main pattern layout and the corrected SRAF patterns are merged into one layout. Thereafter, as described with reference to FIG. 2, the step S270 of determining whether the SRAF patterns of each mesh cell are accurately corrected may be performed by comparing the first photo mask layout 100 and the second photo mask layout 200 by using a Boolean operation. In step S270, when an error of the corrected SRAF patterns occurs, step S250 through step 270 may be performed again (S280).

In at least one embodiment of the present invention, the main pattern layout and the SRAF pattern layout are separated from the first photo mask layout, the SRAF pattern layout is divided into one or more layers including a plurality of mesh cells, and the rule base table is applied to the layers, thereby quickly and systematically correcting the SRAF patterns.

Figure 6:
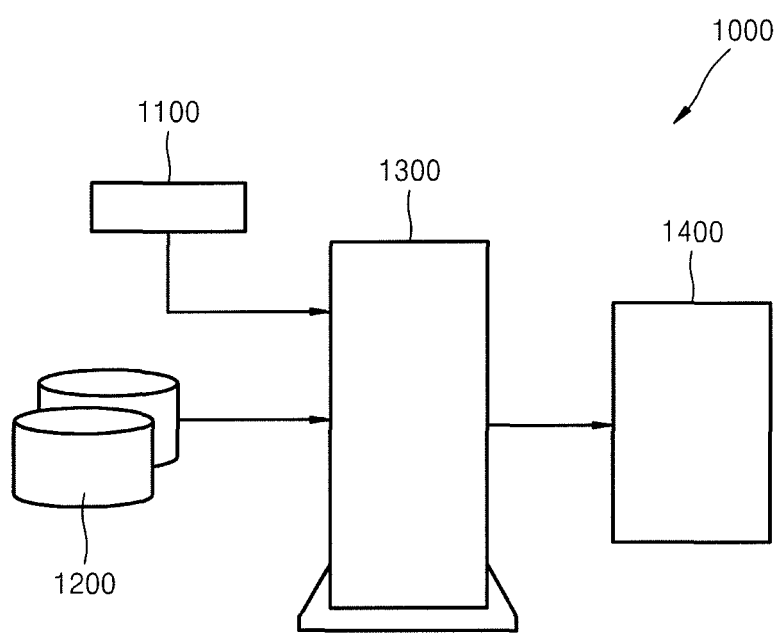
FIG. 6 is a view illustrating a mask imaging system for correcting SRAF patterns according to an exemplary embodiment of the present invention.

FIG. 6 is a view illustrating a mask imaging system 1000 for correcting SRAF patterns according to an exemplary embodiment of the present invention. Referring to FIG. 6, a computer system 1300 for performing a processing step of the SRAF patterns may be a workstation computer. The computer system 1300 may be a stand alone type or a network type, may include a single or multi processor for performing predetermined operations, or may be a parallel processing computer system.

The computer system 1300 performs a series of executable instructions that may be stored in a program storage medium 1100, such as a compact disc (CD) or a digital video disc (DVD), or may be transmitted via a wired/wireless communication network such as the Internet. The computer system 1300 receives a file including information on the first photo mask layout from a layout file storage 1200, for example, a database or another storage medium and performs an instruction and reads the file. The computer system 1300 corrects the SRAF patterns with regard to the first photo mask layout and generates a file including information on the second photo mask layout.

When it is determined that the second photo mask layout is accurately formed by comparing the first photo mask layout and the second photo mask layout for verification, the second photo mask layout may be transferred to a mask writing device 1400, so that a photo mask or a reticule may be manufactured.

As used herein, the computer readable recording medium may be any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves. However, embodiments of the present invention are not limited to the above described media.

At least one embodiment of the present invention uses a rule base table to correct each SRAF pattern corresponding to one or more mesh cells, in order to manufacture the photo mask including SRAF patterns for correcting an optical proximity effect, or in order to correct various SRAF related defects that may occur in an image transferred onto a wafer by a photolithographic process. Therefore, the defects in SRAF patterns per each of predetermined areas of the photo mask layout may be corrected, irrespectively of defect types and the distribution pattern of SRAF patterns, thereby enabling a window of a photo mask manufacturing process to be increased. Furthermore, SRAF patterns may be corrected per mesh cell that require correction, instead of correcting the entire mask data, thereby more quickly and selectively correcting data of SRAF patterns.

At least one embodiment of the present invention provides a computer readable recording medium storing a program for executing an operation used to correct the above described defects in SRAF patterns, and a mask imaging system for performing the operation.

An exemplary embodiment of the present invention includes a computer readable recording medium storing a program for executing a method of creating a photo mask layout. The method includes providing a first photo mask layout including main patterns and SRAF patterns, defining a plurality of mesh cells by dividing the first photo mask layout, generating a rule based table including correction information for correcting defects in the SRAF patterns pertaining to at least one of the plurality of mesh cells, correcting the SRAF patterns by applying values of the rule based table to the SRAF patterns pertaining to each mesh cell, and providing a second photo mask layout including the main patterns and the corrected SRAF patterns.

Another exemplary embodiment of the present invention includes a computer readable recording medium storing a program for executing a method of creating a photo mask layout. The method includes providing a first photo mask layout including main patterns and SRAF patterns, separating a main pattern layout including the main patterns and an SRAF layout including the SRAF patterns, from the first photo mask layout, defining a plurality of mesh cells by dividing the SRAF layout, defining a plurality of layers each including at least one of the plurality of mesh cells, generating a rule based table including correction information used to correct defects in the SRAF patterns, correcting the SRAF patterns by applying the rule based table to the plurality of layers, and providing a second photo mask layout including the main patterns and the corrected SRAF patterns by merging the main pattern layout and the plurality of layers.

Another exemplary embodiment of the present invention includes a mask image system. The mask image system includes a data storage medium providing a first photo mask layout including main patterns and SRAF patterns and a computer system. The computer system performs a method including defining a plurality of mesh cells by dividing the first photo mask layout, generating an rule base table including correction information used to correct defects in the SRAF patterns with regard to at least one of the plurality of mesh cells, correcting the SRAF patterns by applying values of the rule base table to the SRAF patterns pertaining to each mesh cell, and providing a second photo mask layout including the main patterns and the corrected SRAF patterns.

Another exemplary embodiment of the present invention includes a mask image system. The mask image system includes a data storage medium providing a first photo mask layout including main patterns and SRAF patterns and a computer system. The computer system performs a method including separating a main pattern layout including the main patterns and an SRAF layout including the SRAF patterns, from the first photo mask layout, defining a plurality of mesh cells by dividing the SRAF layout, defining a plurality of layers each including at least one of the plurality of mesh cells, generating a rule based table including correction information used to correct defects in the SRAF patterns, correcting the SRAF patterns by applying the rule based table to the plurality of layers, and providing a second photo mask layout including the main patterns and the corrected SRAF patterns by merging the main pattern layout and the plurality of layers.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A method of generating a photo mask layout, the method comprising:
   providing, by a processor, a first photo mask layout including main patterns and sub-resolution assist features (SRAF) patterns, wherein the SRAF patterns are configured to enhance a resolution of the main patterns on a wafer;
   dividing, by a processor, the first photo mask layout into regions of at least two rows and columns to generate a plurality of mesh cells;
   generating, by a processor, a rule based table having at least one entry including coordinate information for identifying at least one of the mesh cells and correction information for correcting defects in the SRAF patterns for the corresponding mesh cells; and
   correcting, by a processor, SRAF patterns by applying a value of the correction information of a corresponding one of the entries to the SRAF patterns located within the mesh cells identified by the coordinate information of the one entry.

2. The method of claim 1, further comprising:
   providing a second photo mask layout including the main patterns and the corrected SRAF patterns;
   verifying the first photo mask layout by comparing the first photo mask layout with the second photo mask layout; and
   correcting the SRAF patterns by re-applying the value of the correction information of the one entry to the SRAF patterns located within the mesh cells identified by the corresponding coordinate information when the comparison determines that the layouts differ from one another.

3. The method of claim 2, wherein the comparing the first photo mask layout and the second photo mask layout is performed by a Boolean operation.

4. The method of claim 1, wherein one of a shape of each mesh cell, a size of each mesh cell, or the number of the plurality of mesh cells is determined according to at least one defect at a photo mask level or at a wafer level.

5. The method of claim 1, wherein the value of the correction information includes a value used to correct at least one of a shape, size, or number of each SRAF pattern.

6. The method of claim 5, wherein the value used to correct the size of each SRAF pattern includes at least one of a ratio, a critical value, and a bias value.

7. The method of claim 1, wherein the dividing the plurality of mesh cells comprises:
   separating a main pattern layout including the main patterns and an SRAF layout including the SRAF patterns, from the first photo mask layout; and
   defining the plurality of mesh cells by dividing the SRAF layout into regions,
   wherein correcting the SRAF patterns comprises applying the values of the correction information to the SRAF layout.

8. The method of claim 7, wherein the correcting the SRAF patterns comprises:
   defining a plurality of layers from the SRAF layout, each layer including at least one of the plurality of mesh cells; and
   applying the values of the correction information to at least one of the plurality of layers.

9. The method of claim 8, wherein the layers include a subset of the plurality of mesh cells to which the same rule based table is applied.

10. The method of claim 8, wherein the correcting the SRAF patterns further comprises:
    merging the main pattern layout and the plurality of layers.

11. A method of generating a photo mask layout, the method comprising:
    providing, by a processor, a first photo mask layout including main patterns and SRAF patterns, wherein the SRAF patterns are configured to enhance a resolution of the main patterns on a wafer;
    separating, by a processor, a main pattern layout including the main patterns and an SRAF layout including the SRAF patterns, from the first photo mask layout;
    dividing, by a processor, the SRAF layout into regions into a matrix of at least two rows and columns to generate a plurality of mesh cells;
    determining, by a processor, a plurality of layers, each including at least one of the plurality of mesh cells;
    generating, by a processor, a rule based table including correction information used to correct defects in the SRAF patterns and coordinate information to identify coordinates of the SRAF patterns within the matrix; and
    correcting, by the processor, the SRAF patterns by applying a value of the correction information to the mesh cells of the plurality of layers identified by the corresponding coordinate information.

12. The method of claim 11, further comprising:
providing a second photo mask layout including the main patterns and the corrected SRAF patterns by merging the main pattern layout and the plurality of layers;
verifying the first photo mask layout by comparing the first photo mask layout with the second photo mask layout; and
correcting the SRAF patterns by re-applying the value of the correction information to the SRAF patterns in the mesh cells identified by the corresponding coordinate information when the comparison determines that the layouts are identical to one another.

13. The method of claim 12, wherein comparing the first photo mask layout and the second photo mask layout is performed by a Boolean operation.

14. The method of claim 13, wherein an offset value is applied to perform the Boolean operation.

15. The method of claim 11, wherein one of a shape of each mesh cell, a size of each mesh cell, or the number of the plurality of mesh cells is determined according to at least one defect at a photo mask level or at a wafer level.

16. The method of claim 15, wherein the value used to correct the size of each SRAF pattern includes at least one of a ratio, a critical value, and a bias value.

17. The method of claim 11, wherein the value of the correction information includes a value used to correct at least one of a shape, size, or number of each SRAF pattern.

18. A mask image system comprising:
a data storage medium providing a first photo mask layout including main patterns and SRAF patterns, wherein the SRAF patterns are configured to enhance a resolution of the main patterns on a wafer; and
a computer system, wherein the computer system defines a plurality of mesh cells by dividing the first photo mask layout into regions of at least two rows and columns, generates a rule based table including correction information to correct defects in the SRAF patterns for at least one of the plurality of mesh cells and coordinate information to identify the corresponding mesh cells, and corrects the SRAF patterns by applying values of the correction information to the SRAF patterns located within the mesh cells identified by the coordinate information.

19. A mask image system comprising:
a data storage medium storing a first photo mask layout including main patterns and SRAF patterns, wherein the SRAF patterns are configured to enhance a resolution of the main patterns on a wafer; and
a computer system, wherein the computer system separates a main pattern layout including the main patterns and an SRAF layout including the SRAF patterns, from the first photo mask layout, defines a plurality of mesh cells by dividing the SRAF layout into a matrix having at least two rows and columns, defines a plurality of layers that each include at least one of the plurality of mesh cells, generates a rule based table including correction information used to correct defects in the SRAF patterns and coordinate information to identify coordinates of the SRAF patterns within the matrix, and corrects the SRAF patterns by applying the value of the correction information to the mesh cells of the plurality of layers identified by the corresponding coordinate information.

20. A method of generating a photo mask layout, the method comprising:
providing, by a processor, a first photo mask layout including main patterns and sub-resolution assist features (SRAF) patterns, wherein the SRAF patterns are configured to enhance a resolution of the main patterns on a photomask;
dividing, by a processor, the first photo mask layout into regions of at least two rows and columns to generate a plurality of mesh cells;
generating, by a processor, a rule based table having at least one entry including coordinate information for identifying at least one of the mesh cells and correction information for correcting defects in the SRAF patterns for the corresponding mesh cells;
correcting, by a processor, SRAF patterns by applying a value of the correction information of a corresponding one of the entries to the SRAF patterns located within the mesh cells identified by the coordinate information of the one entry;
providing a second photo mask layout including the main patterns and the corrected SRAF patterns;
verifying the first photo mask layout by comparing the first photo mask layout with the second photo mask layout; and
correcting the SRAF patterns by re-applying the value of the correction information of the one entry to the SRAF patterns located within the mesh cells identified by the corresponding coordinate information when the comparison determines that the layouts differ from one another,
wherein the comparing the first photo mask layout and the second photo mask layout is performed by a Boolean operation, and
wherein an offset value is applied to perform the Boolean operation.

* * * * *